United States Patent [19]
Zink et al.

[11] Patent Number: 5,946,241
[45] Date of Patent: Aug. 31, 1999

[54] NON-VOLATILE MEMORY IN INTEGRATED CIRCUIT FORM WITH FAST READING

[75] Inventors: Sébastien Zink; David Naura, both of Aix en Provence, France

[73] Assignee: SGS-Thomson Microelectronics S.A., Saint Genis, France

[21] Appl. No.: 08/908,322

[22] Filed: Aug. 7, 1997

[30] Foreign Application Priority Data

Aug. 8, 1996 [FR] France .................................. 96 10176

[51] Int. Cl.⁶ .................................................. G11C 7/00
[52] U.S. Cl. .............................. 365/189.01; 365/189.03; 365/185.26; 365/191
[58] Field of Search ......................... 365/189.01, 185.21, 365/185.19, 185.33, 191

[56] References Cited

U.S. PATENT DOCUMENTS

| | | | |
|---|---|---|---|
| 5,237,534 | 8/1993 | Tanaka et al. | 365/208 |
| 5,537,349 | 7/1996 | Devin | 365/185.33 |
| 5,544,114 | 8/1996 | Gaultier et al. | 365/202 |
| 5,696,716 | 12/1997 | Rolandi | 365/185.21 |
| 5,748,536 | 5/1998 | Kwon et al. | 365/185.25 |
| 5,751,635 | 5/1998 | Wong et al. | 365/185.19 |

FOREIGN PATENT DOCUMENTS

| | | | |
|---|---|---|---|
| 0 301 277 | 2/1989 | European Pat. Off. | G11C 7/00 |
| 0 506 989 | 10/1992 | European Pat. Off. | G11C 16/06 |
| 0 526 427 | 2/1993 | European Pat. Off. | G11C 16/06 |

OTHER PUBLICATIONS

Search Report from French patent application No. 96 10176, filed Aug. 8, 1996.

*Primary Examiner*—Viet Q. Nguyen
*Attorney, Agent, or Firm*—Wolf, Greenfield & Sacks, P.C.

[57] ABSTRACT

The disclosure relates to the field of memories in integrated circuit form. It can be applied more particularly to the field of EPROM or EEPROM type electrically programmable non-volatile memories. A memory array and read circuits are proposed in order to improve the time taken to read a data element. During a reading operation a read circuit is connected firstly to an erased cell and secondly to a programmed cell. The memory outputs a 1 for a read operation that access a first memory cell having an erased state and a second memory cell having a programmed cell, and further, the memory outputs a 0 for a read operation that access a first memory cell having a programmed state and a second memory cell having an erased state.

24 Claims, 4 Drawing Sheets

FIG_1
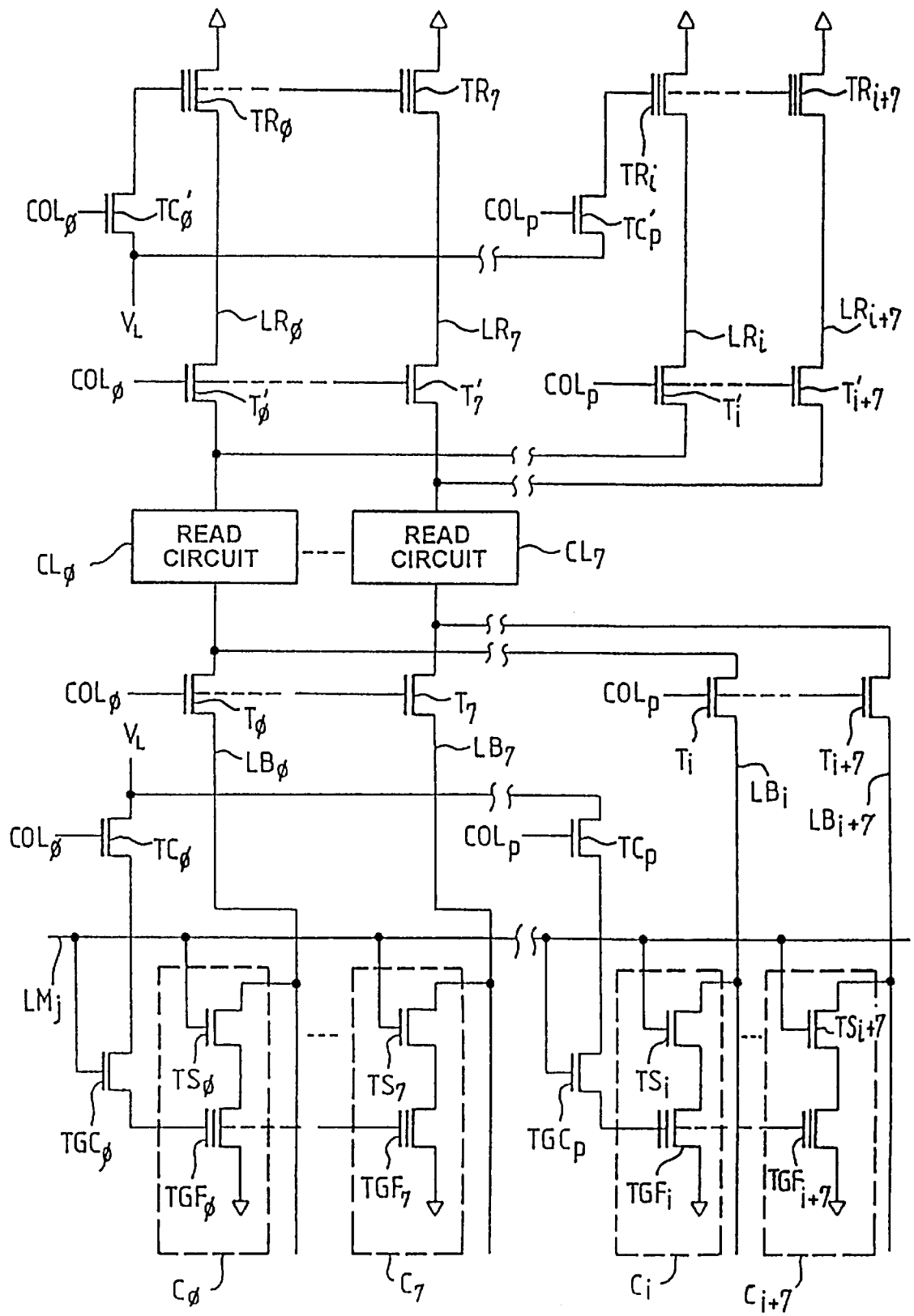

FIG_2
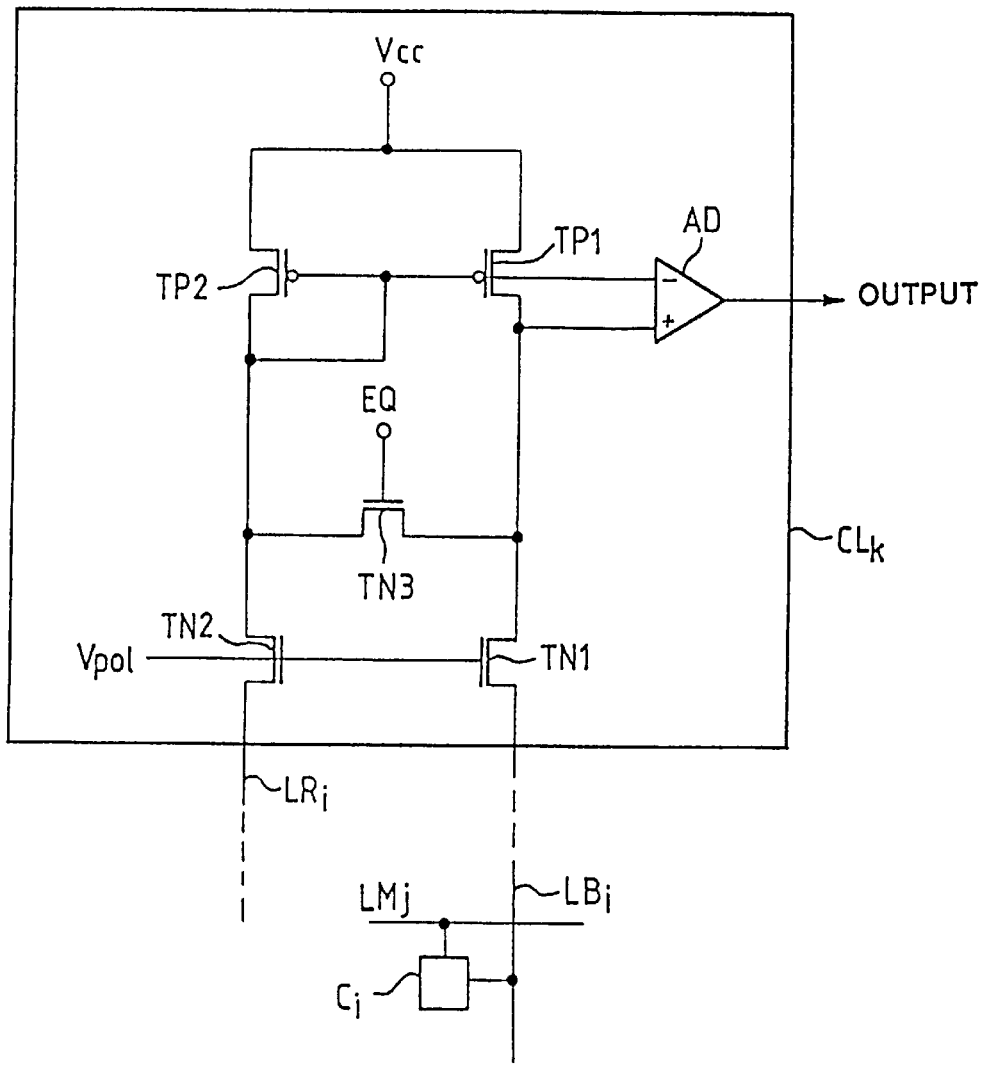
FIG_5
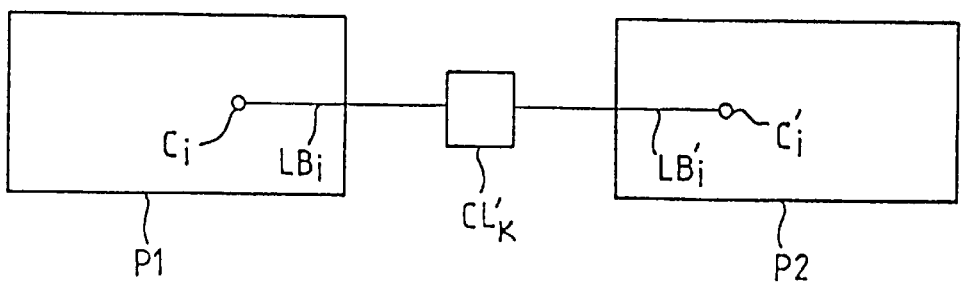

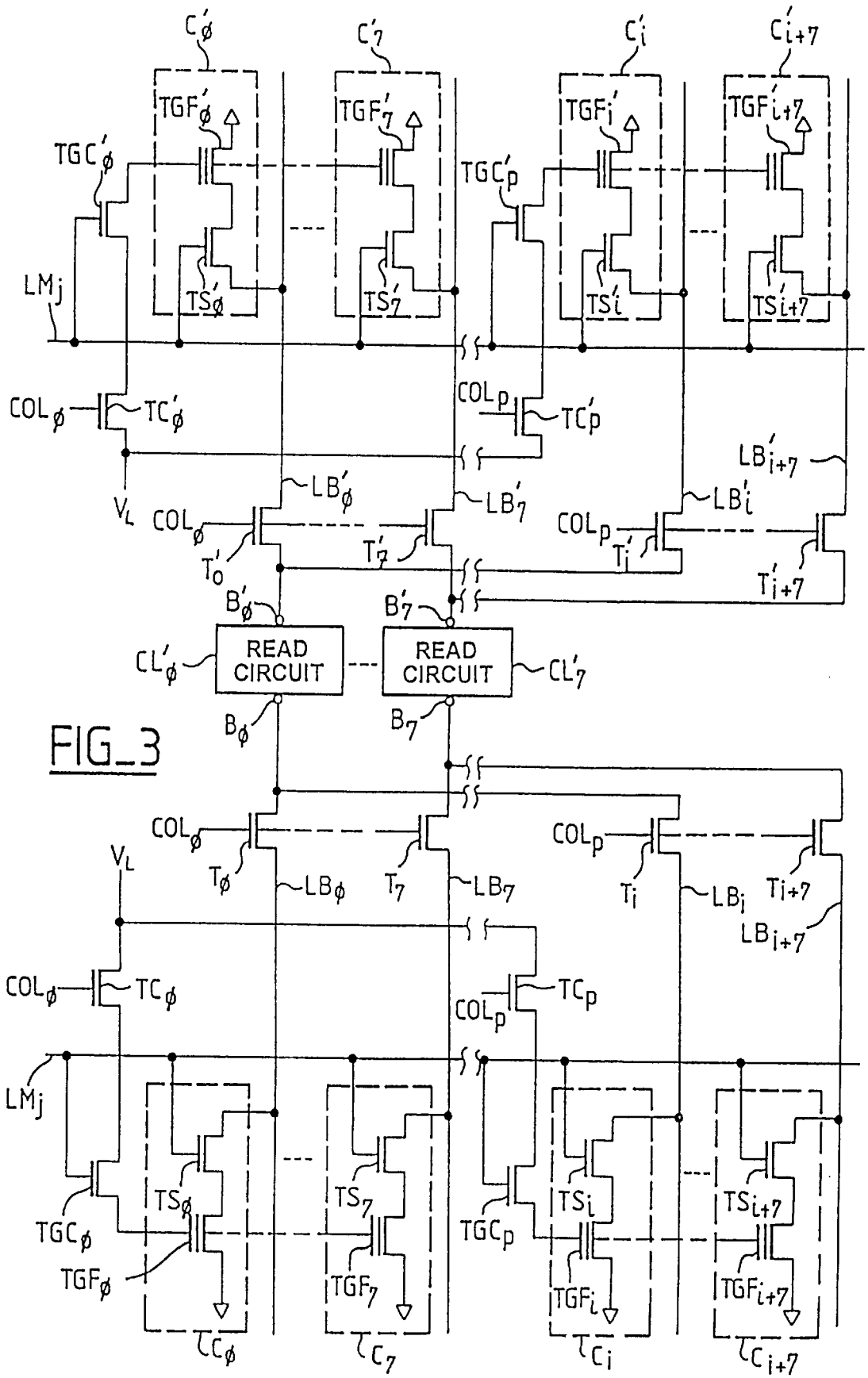
FIG_3

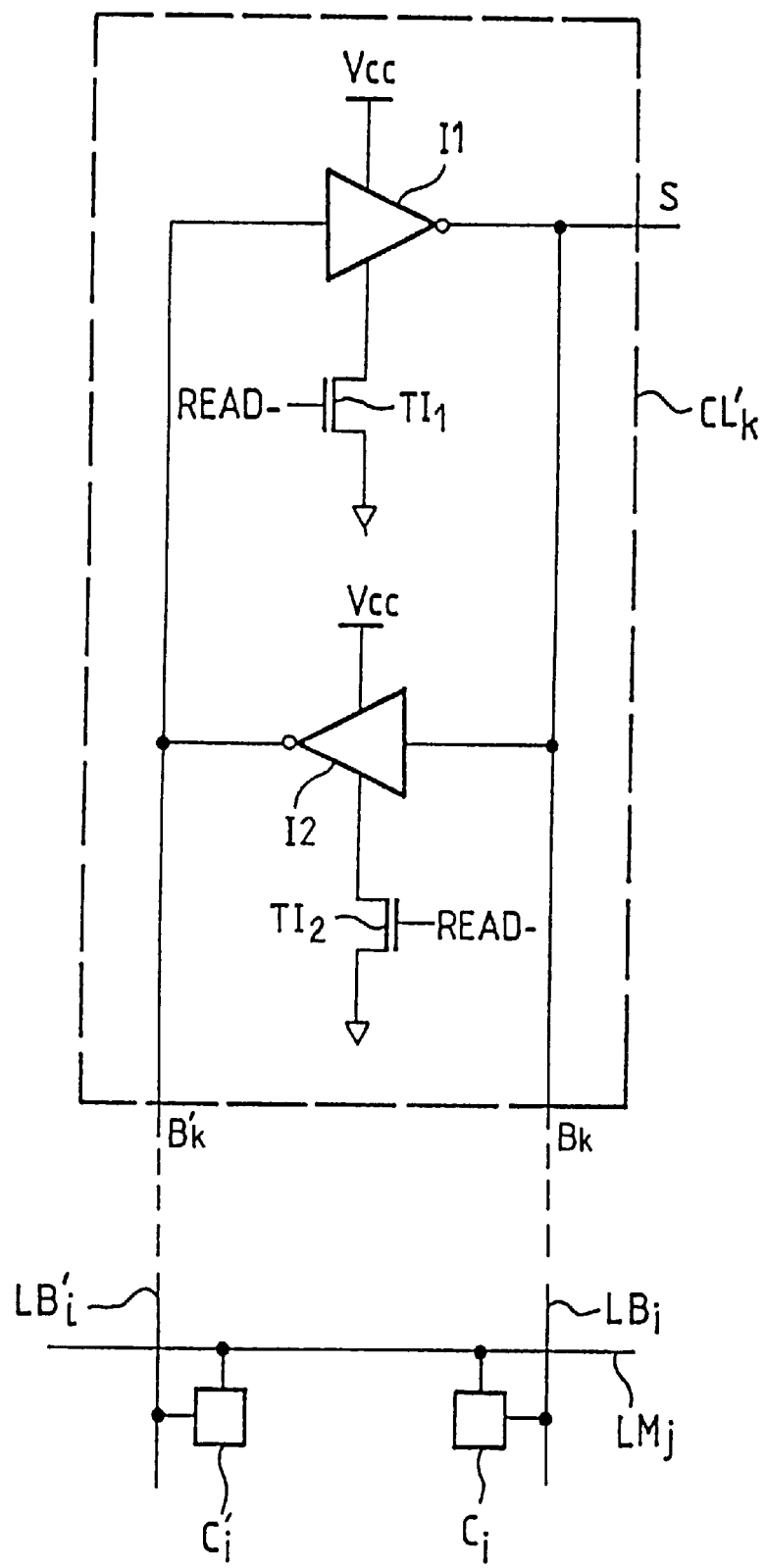

NON-VOLATILE MEMORY IN INTEGRATED CIRCUIT FORM WITH FAST READING

BACKGROUND OF THE INVENTION

1. Field of the Invention

The invention relates to the architecture of memories in integrated circuit form. The invention can be applied more particularly in the field of EPROM or EEPROM type electrically programmable non-volatile memories.

The memories are organized in networks of cells forming a plurality of columns and a plurality of rows. The respective cells of each column are connected to a respective bit line and the respective cells of each row are connected to a word line. The bit line enables the transmission of an information element which provides the state of a memory cell located at the intersection of the bit line and a selected word line.

Read circuits are connected to the bit lines, possibly by means of a multiplexer if there are several bit lines for a single read circuit. Hereinafter, we shall consider a memory organized in eight-bit words, therefore comprising eight read circuits.

2. Discussion of the Related Art

A known memory architecture comprises a memory array comprising a network of memory cells associated with read circuits and reference memory cells. The reference cells are blank and may be placed outside the memory array or integrated into the memory array in the form of an additional row. Each reference cell is connected to a bit line called a reference line.

A schematic drawing of a memory of this kind is shown in FIG. 1. The memory has eight read circuits $CL_0, \ldots, CL_7$, each read circuit $CL_k$ (k ranging from 0 to 7) being associated firstly with a plurality of reference lines $LR_0$, $LR_i$, $LR_{i+7}$, $LR_{i+15}$ . . . and secondly with a plurality of bit lines $LB_0$, $LB_i$, $LB_{i+7}$, $Lb_{i+15}$, etc. Transistors $T_i$ through $T_{i+7}$ and $T'_i$ through $T'_{i+7}$ enable the selection respectively of eight bit lines $LB_i$ through $LB_{i+7}$ and eight corresponding reference lines $LR_i$ through $LR_{i+7}$ during a memory word reading operation. During this reading operation, a control signal $COL_p$ coming from a column decoder is applied simultaneously to the control gate of transistors $T_i$ through $T_{i+7}$ and $T'_i$ through $T'_{i+7}$, turning these transistors on. Thus, for an eight-bit memory, the control signal $COL_p$ is applied simultaneously to the gate of eight transistors $T_i$ and eight transistors $T'_i(I=p*8)$ turning all these transistors on.

A memory cell $C_i$ is connected to bit line $LB_i$. Memory cell $C_i$ consists of a selection transistor $TS_i$ and a floating-gate transistor $TGF_i$ that are series-connected. The drain of selection transistor $TS_i$ is connected to bit line $LB_i$ and its control gate is connected to a word line $Lm_j$. The source of transistor $TGF_i$ is connected to the ground and its control gate receives a read voltage $V_L$ by means of two transistors $TGC_p$ and $TC_p$ that are series-connected. Transistor $TGC_p$ is a transistor providing access to the control gate of the transistor $TGF_i$. Its source is connected to the control gate of transistor $TGF_i$, its control gate is connected to word line $LM_j$ and its drain is connected to the source of control transistor $TC_p$. Control transistor $TC_p$ receives read voltage $V_L$ at its source while signal $COL_p$ is applied to its control gate. Cell $C_i$ may have two states: an erase state in which a positive charge is trapped in the floating-gate of the floating-gate transistor and a programmed state in which a negative charge is trapped in the floating-gate of the floating-gate transistor. The conduction threshold is about −1V for the erased cell and 4V for the programmed cell.

Reference lines $LR_i$ comprise, in addition to transistor $T'_i$, a floating-gate transistor called a reference transistor $TR_i$ that constitutes the reference cell. The reference cell is blank. This means that the floating-gate of transistor $TR_i$ is neither charged with electrical charges nor depleted of them. The source of transistor $TR_i$ is connected to a ground terminal and its drain is connected to the source of transistor $T'_i$. Transistor $TR_i$ receives the read voltage $V_L$ at its control gate through a control transistor $TC'_p$ activated by signal $COL_p$. The source of transistor $TC'_p$ is connected to the control gate of transistor $TR_i$ and its drain receives read voltage $V_L$. The value of read voltage $V_L$ is usually equal to 1.5 volts in order to detect the programmed or erased state of a memory cell $C_i$ as well as the blank state of the reference cells.

FIG. 1 shows memory cells $C_0$, $C_7$, $C_i$ and $C_{i+7}$ respectively located at the intersection of word line $LM_j$ and bit lines $LB_0$, $LB_7$, $LB_i$ and $LB_{i+7}$. There is only one pair of transistors $TGC_p$ and $TC_p$ for eight adjacent memory cells, since eight of the memory cells are read simultaneously. FIG. 1 also shows corresponding reference lines $LR_0$, $LR_7$, $LR_i$ and $LR_{i+7}$. Just as in the case of transistors $TC_p$ and $TGC_p$, only one transistor $TC'_p$ is provided for eight reference cells. A particular word is read when (i) word line $Lm_j$ is active; (ii) signal $COL_p$ is applied to the eight control transistors $TC_p$ and $TC'_p$ respectively and eight transistors $T_i$ and $T'_i$ respectively and (iii) each read circuit receives a respective bit line and reference line of the word to be read.

During a memory read operation, the presence or absence of a current in the bit line connected to the selected cell is detected. A current of this kind exists if the cell is erased or blank, whereas a current does not exist if the cell is programmed. To detect the presence or absence of a current, the current flowing in the bit line is compared with the current flowing in the corresponding reference line.

An example of a known read circuit $CL_k$ is shown in FIG. 2.

The memory cell $C_i$ selected by word line $LM_j$ delivers an information element on the bit line $LB_i$. The bit line $LB_i$ is precharged with voltage in a precharging stage by a precharging transistor TN1 whose function is to provide a precharging current to the bit line while limiting the precharging potential to a specified value, preferably in the region of one volt.

The corresponding reference line $LR_i$ is also precharged to an identical voltage value by a second precharging transistor TN2. During the reading stage, the reference line consumes current equivalent to that consumed by a blank memory cell.

Transistors TN1 and TN2 are preferably N channel transistors, their source being connected to bit line $LB_i$ and to reference line $LR_i$ respectively. To simplify the description, the gates of transistors TN1 and TN2 are shown as being connected to a biasing source Vpol. The value of voltage Vpol defines the upper limit of the precharging voltage of lines $LB_i$ and $LR_i$.

To read the state of the cell $C_i$, a comparison is made between the current consumed by the bit line $LB_i$ and reference line $LR_i$. More specifically, the current consumed by the bit line is compared with a fraction of the current normally consumed by a blank cell.

To this end, the drains of transistors TN1 and TN2 are supplied by two arms of a current mirror with a copying ratio k that is smaller than 1. The first arm of the mirror has a copying transistor TP1 and the second arm has a reference transistor TP2. Transistor TP1 copies the current flowing in reference transistor TP2 with a ratio k. This ratio k is the ratio of the geometries of the transistors.

Copying transistor TP1 is a P channel transistor having its source connected to a supply terminal Vcc and its drain connected to the drain of transistor TN1.

In the same way, reference transistor TP2 is a P channel transistor having its source connected to supply terminal Vcc and its drain connected to the drain of transistor TN2.

The gates of transistors TP1 and TP2 are connected and the gate of reference transistor TP2 is connected to its drain. We thus have a standard current copying pattern.

A differential amplifier AD has its inputs connected to the drains of transistors TP1 and TP2 to measure the difference between the potentials at these two drains. This difference is zero if the currents in transistors TP1 and TP2 are in the ratio of geometries k. The output of amplifier AD gives a signal that provides an indication of whether the ratio of the currents is greater than k or smaller than k.

Finally, a compensation transistor TN3 is designed to reset the differential input voltage at the terminals of the differential amplifier in a balancing phase that follows the precharging phase and precedes the actual reading phase. This balancing phase makes it possible to reduce the differential voltage at the input of amplifier AD to a value that is as close as possible to zero, whatever the logic state read in a memory state at the previous reading stage. Transistor TN3 is, for example, an N channel transistor that is made conductive during a balancing stage EQ.

The stage of reading a memory cell of this type of memory therefore comprises a phase for precharging the bit line associated with the memory cell, a phase of balancing between the associated bit line and the corresponding reference line and a phase for the actual reading of the memory cell. The time taken to read a memory cell of a non-volatile memory of this type is about 30 nanoseconds.

An aim of the invention is to reduce the time for reading the cells of a non-volatile memory. Thus, the invention proposes a memory structure that can be used to eliminate the stages for the precharging and balancing of the bit lines of the memory array.

To improve the time of reading of the cells, the present invention proposes the storage of the information elements by the use of two memory cells, one programmed and the other erased.

To implement this solution, it is necessary to modify the structure of the memory array as well as that of the associated read circuits.

SUMMARY OF THE INVENTION

Thus, an object of the invention is a non-volatile memory in integrated circuit form designed to contain data elements of n bits comprising a memory array with bit lines to which there are connected memory cells and word lines used to select said memory cells, as well as n read circuits each connected for every read operation by first and second terminals to a first and second bit line, a first and second memory cell being connected respectively to said first and second bit lines, wherein, for any read operation, each read cell is connected firstly to a programmed cell and secondly to an erased cell, the bit read by the read circuit being 1 or 0 depending on whether each of the programmed and erased cells is connected to one or the other of said first and second terminals and wherein the voltage for reading the said programmed and erased cells is a zero voltage.

The position of the programmed cell and of the erased cell with respect to the terminals of the read circuit determines the value of the bit read by the read circuit.

Preferably, the memory array has two parts that are symmetrical with respect to each of said read circuits owing to the fact that the memory cells of one of these parts are connectable exclusively to one of said first and second terminals of said read circuits while the memory cells of the other part are connectable exclusively to the other of said first and second terminals of said read circuits.

Thus, for each bit, the programmed cell will belong to one part of the memory array while the erased cell will belong to the part that is symmetrical to it.

The use of a zero voltage as a read voltage results in the elimination of the setup time of a classical read voltage at the moment of the selection of the memory. Consequently, this aspect contributes to decrease the reading time of the memory. Furthermore, according to the invention, each read circuit comprises a first inverter and a second inverter, the input of one inverter being connected to the output of the other and vice versa, the input of the first inverter and the input of the second inverter being connected respectively to said first and second terminals of said read circuit, the inverters being constituted by a P type transistor and an N type transistor series-connected between a supply terminal and a ground terminal, the control gates of said transistors being connected to each other to constitute the input of the inverter and the drains being connected to each other to constitute the output of the inverter.

In order to optimize the reading time of the memory, each read circuit inverter furthermore comprises an additional transistor used to interrupt the connection between the transistors of said inverter and the ground terminal.

BRIEF DESCRIPTION OF THE DRAWINGS

Other features and advantages of the invention shall appear from the following detailed description made with reference to the appended drawings, of which:

FIG. 1 shows a partially schematic—partially block diagram of a conventional non-volatile memory structure having a memory array with reference cells;

FIG. 2 shows a schematic diagram of a conventional read circuit shown as a block diagram in FIG. 1;

FIG. 3 shows a partially schematic—partially block diagram of a non-volatile memory according to the invention;

FIG. 4 shows a schematic diagram of a read circuit according to the invention shown in FIG. 3; and FIG. 5 shows a block diagram of a non-volatile memory as in FIG. 3 with a central reading circuit.

DETAILED DESCRIPTION

According to the invention, the memory array has programmed and an erased memory cell on either side of a plurality of read circuits $CL'_0, \ldots, CL'_7$. Consequently during the reading stage, for each bit of a word only the erased cell consumes current. A read circuit is described here below in FIG. 4.

In order to obtain a perfectly symmetrical memory array, the memory array is divided into two identical half-arrays: an upper half-array and a lower half-array. Each half-array is identical to the part of the memory array pertaining to cell $C_i$ described in FIG. 1. Each read circuit $CL'_0, \ldots, CL'_7$ is associated firstly with a plurality of bit lines $LB'_0, LB'_i, LB'_{i+7}, \ldots$ belonging to the upper half-array and secondly to a plurality of bit lines $LB'_0, LB'_i, LB'_{i+7}, \ldots$ belonging to the lower half-array. Memory cells $C_i$ and $C'_i$ are respectively connected to bit lines $LB_i$ and $LB'_i$. The read circuits are preferably located between the two half-arrays. The perfect symmetry of the memory array provides for a simultaneous selection of the memory cells $C_i$ and $C'_i$ in both half-arrays.

References $B_k$ and $B'_k$ designate the terminals of read circuit CL'k used to provide for the connection with bit lines $LB_i$ and $LB'_i$ when the $p^{th}$ word, activated by signal $COL_p$, is read.

Just as in the case of FIG. 1, each memory cell $C_i$ consists of a selection transistor $TS_i$ and a floating-gate transistor TGF. To apply the read voltage $V_L$ to the control gate of floating-gate transistor $TGF_i$, the lower memory half-array also has an access transistor TGC and a control transistor $TC_i$. These transistors are arranged as shown in FIG. 1. This description can be applied also to the upper half-array pertaining to the memory cells $C'_i$.

To store an information element in the memory of the invention, two cells are written in: one cell is programmed while the other is erased. Depending on whether it is sought to obtain a "1" or "0" at the output of the read circuit, the programmed cell will belong to the upper half-array or to the lower half-array and the erased cell will then belong to the symmetrical array.

Since all the cells of the memory array are programmed or erased but are not blank, a very small read voltage $V_L$ is enough to determine the state of a cell, and at most this voltage could be zero.

In the case of a zero voltage, there is no setup time of the read voltage. This is a major advantage especially in the case of parallel memories for which the designing of generators producing read voltage $V_L$ may pose a problem. Indeed, conventionally, the read voltage $V_L$ typically has a value of 1.5 volts and often the generators must therefore have a high fan-out to enable the swift application of a voltage of this kind to a large number of memory cells. It is sometimes even necessary to duplicate the generators. The invention makes it possible to overcome this problem.

This type of non-volatile memory using two memory cells to memorize an information element will be particularly advantageous in the case of small-sized non-volatile memories requiring very fast access time.

FIG. 4 shows a read circuit $CL'_k$ of the non-volatile memory according to the invention. This read circuit is connected firstly to bit line $LB_i$ and secondly to bit line $LB'_i$. According to FIG. 3, memory cells $C_i$ and $C'_i$ are connected respectively to bit lines $LB_i$ and $LB'_i$ and are selected by word line $Lm_j$. Upon receipt of signal $COL_p$, the $p^{th}$ word is read, by coupling eight respective bit lines $LB_i$ through $LB_{i+7}$ and $LB'_i$ through $LB'_{i+7}$ to their respective reading circuits $CL'_0$ through $CL'_7$.

The structure of read circuits $CL'_k$ is the same structure as the structure of memory cells of standard SRAM type static memories. Read circuit $CL'_k$ consists of two inverters I1 and I2 mounted in a loop, the output of each of them is connected to the input of the other. Bit line $LB_i$ is connected to the input of inverter I2 and the bit line $LB'_i$ is connected to the input of inverter I1. In the example of FIG. 4, output S of read circuit $CL'_k$ corresponds to the output of inverter I1.

Preferably, inverters I1 and I2 are provided with an additional transistor, respectively TI1 and TI2. Each additional transistor is series-connected with the N channel transistor of the inverter and receives a command signal READ- at its gate. This signal is active outside the reading stages. These additional transistors enable the ground to be disconnected from inverters I1 and I2 during the read stages to prevent any conflict with the ground of the erased cell: this would entail penalties in terms of the time taken to read an information element.

According to two different embodiments, the additional transistor is placed either between the N channel transistor of the inverter and the ground terminal or between the output of the inverter and the N channel transistor of the inverter.

The working of a circuit of this kind is that of a standard latch type storage circuit whose input and output states are dictated by two distinct memory cells.

If memory cell $C_i$ is programmed and memory cell $C'_i$ is erased, the output will deliver a logic "1". Conversely, if memory cell $C_i$ is erased and memory cell $C'_i$ is programmed, the output will deliver a logic "0".

FIG. 5 shows a simplified block diagram of a non-volatile memory as shown in FIG. 3. Two memory half-arrays P1 and P2 are coupled to one central reading circuit $CL'_k$. Read circuit $CL'_k$ is connected firstly to a memory cell $C_i$ by means of a bit line $LB_i$ and secondly to a memory cell $C'_i$ by means of a bit line $LB'_i$. Memory cells $C_i$ and $C'_i$ belong respectively to memory half-array P1 and P2. This diagram enables the simplified display of a possible arrangement of the non-volatile memory according to the invention.

The time taken to read a cell of a memory of this kind can be estimated at about 10 nanoseconds as compared with 30 nanoseconds with the prior art techniques.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A non-volatile memory in integrated circuit form designed to contain data elements of n bits comprising:
   a memory array with bit lines to which there are connected memory cells;
   word lines used to select said memory cells; and
   n read circuits each connected for every read operation by first and second terminals to a first and second bit line, respectively, a first and second memory cell being connected to said first and second bit lines, respectively,
   wherein, for any read operation, each read circuit is connected to a programmed cell and to an erased cell, the bit read by the read circuit being 1 or 0 depending on whether the first and second terminals are connected to the programmed and erased cells, respectively, or to the erased and programmed cells, respectively, and wherein the voltage for reading the said programmed and erased cells is a substantially zero voltage.

2. A memory according to claim 1, wherein the memory array has two parts that are symmetrical with respect to each of said read circuits, owing to the fact that the memory cells of one of these parts are connectable exclusively to one of said first and second terminals of said read circuits while the memory cells of the other part are connectable exclusively to the other of said first and second terminals of said read circuits.

3. A memory according to claim 1, wherein each read circuit comprises a first inverter and a second inverter, the input of one inverter being connected to the output of the other and vice versa, the input of the first inverter and the input of the second inverter being connected respectively to said first and second terminals of said read circuit, the inverters including a P type transistor and an N type transistor series-connected between a supply terminal and a ground terminal, the control gates of said transistors being connected to each other to constitute the input of the inverter and the drains being connected to each other to constitute the output of the inverter.

4. A memory according to claim 3, wherein each read circuit inverter further comprises an additional transistor used to break the connection between the transistors of said inverter and the ground terminal.

5. A memory according to claim 4, wherein the additional transistor is placed between the N type transistor of the inverter and the ground terminal.

6. A memory according to claim 4, wherein the additional transistor is placed between the output of the inverter and the N type transistor of the inverter.

7. A non-volatile memory in integrated circuit form capable of storing m words each of n bits, the non-volatile memory comprising:

a first memory array having a first set of m word lines and a first set of n bit lines;

n first memory cells connected to a respective word line of the first set of m word lines, further, each first memory cell is connected to a respective bit line of the first set of n bit lines;

a second memory array having a second set of m word lines and a second set of n bit lines;

n second memory cells connected to a respective word line of the second set of m word lines, further, each second memory cell is connected to a respective bit line of the second set of n bit lines;

n read circuits, each read circuit is selectively coupled to a respective bit line of the first set of n bit lines and a respective bit line of the second set of n bit lines, one of the first and one of the second memory cells which are respectively connected to the respective bit line of the first and the respective one bit line of the second set of n bit lines, is programmed and the other is erased;

wherein, during a read operation, each read circuit is connected to the respective bit line of the first set of n bit lines and the respective bit line of the second set of n bit lines, so that each read circuit is connected to a respective programmed memory cell and a respective erased memory cell, an output of each read circuit outputting a 1 when the first memory cell connected to the read circuit is programmed and the second memory cell connected to the read circuit is erased, and further, the read circuit outputting a 0 when the first memory cell connected to the read circuit is erased and the second memory cell connected to the read circuit is programmed and wherein the voltage for reading the said programmed and erased cells is a zero voltage.

8. A non-volatile memory as in claim 7, wherein the first and second memory arrays are symmetrical with respect to each of the read circuits, each read circuit having a first terminal exclusively selectively coupled to the respective bit of the first set of n bit lines and further, each read circuit having a second terminal exclusively selectively coupled to the respective bit of the second set of n bit lines.

9. A non-volatile memory as in claim 8, wherein
each read circuit comprises a first inverter and a second inverter, the input of the first inverter is connected to the output of the second inverter, the input of the first inverter is further connected to the first terminal of the read circuit and the input of the second inverter is connected to the second terminal of the read circuit, each inverter having a P type and an N type transistors series connected between a power and ground terminal, the control gate of the N type and P type transistors are coupled to each other, constituting the input of the inverter and the drains of the N type and P type transistors are coupled to each other, constituting the output of the inverter.

10. A memory according to claim 9, wherein each inverter further comprises an additional transistor for breaking the connection between the N type and P type transistors and the ground terminal.

11. A memory according to claim 10, wherein each additional transistor is coupled between the N type transistor and the ground terminal.

12. A memory according to claim 10, wherein the additional transistor is coupled between the output of the inverter and the N type transistor.

13. A memory according to claim 8, wherein a bit line connected to an erased memory cell has current flowing through it, and a bit line connected to a programmed memory cell has no current flowing through it.

14. A memory according to claim 13, wherein during a read operation, the presence or absence of the current in the bit lines connected to the read circuit determines the output of the read circuit.

15. A memory according to claim 8, wherein each memory cell comprises:

a first transistor having a gate controlled by one of the m word lines, a drain connected to a bit line, and further having a source;

a floating gate transistor having a gate controlled by a second transistor, a drain coupled to the source of the first transistor and a source connected to ground;

wherein, during a read operation, a read voltage activates the second transistor which activates the floating gate transistor and further, during a read operation, the one of the m word lines which is connected to the gate of the first transistor activates the first transistor, so that the drain of the first transistor provides an output to the respective bit line, resulting in a current flowing in the bit line when the memory cell is erased and no current in the bit line when the memory cell is programmed.

16. A memory according to claim 15, wherein for each word, there is only one second transistor controlling all of the gates of all floating transistor of the memory cells.

17. A memory according to claim 16, wherein a first control signal couples each read circuit to the respective bit lines and further, each control signal activates the second transistor.

18. A non-volatile memory in integrated circuit form designed to contain data elements of n bits including:

n read circuits, a first memory array including a first set of n bit lines and a first set of n memory cells, and a second memory array including a second set of n bit lines and a second set of n memory cells, wherein j'th and J'th bit lines couple a j'th read circuit to j'th and J'th memory cells, respectively, and wherein the j'th and J'th memory cells are either in a 1 and 0 state, respectively, or a 0 and 1 state, respectively; and control signal lines used to select memory cells to be read, wherein, for any read operation, the j'th read circuit outputs a signal representing a 1 or a 0 state depending on whether the j'th memory cell is in the 1 or 0 state, respectively.

19. The non-volatile memory of claim 18, wherein a voltage for reading the memory cells is substantially a zero voltage.

20. The non-volatile memory of claim 18, wherein the j'th read circuit is coupled symmetrically to the j'th and J'th memory cells.

21. The non-volatile memory of claim 20, wherein the memory cells include floating gate transistors and the read cells include invertors coupled to ground by transistors.

22. A method for processing binary data including a storing step, wherein a first two-state component is placed in a first state and an associated second two-state component is placed in a second state that is different from the first state, wherein a combination of the first and second components has two possible states.

23. The method of claim 22, further comprising a reading step, wherein the states of the two components are sensed by a latch and an output representing the state of the combination is output.

24. The method of claim 23, wherein the two state components are symmetrical with respect to the sensor.

* * * * *